United States Patent
Hama

[11] Patent Number: 6,084,696
[45] Date of Patent: Jul. 4, 2000

[54] LASER SCANNING OPTICAL SYSTEM

[75] Inventor: Yoshihiro Hama, Saitama-ken, Japan

[73] Assignee: Asahi Kogaku Kogyo Kabushiki Kaisha, Tokyo, Japan

[21] Appl. No.: 09/127,809

[22] Filed: Aug. 3, 1998

[30] Foreign Application Priority Data

Aug. 1, 1997 [JP] Japan ................................. 9-207767

[51] Int. Cl.[7] ................................................. G02B 26/08
[52] U.S. Cl. ........................... 359/196; 359/662; 359/205; 359/206; 359/216; 359/217; 359/218; 359/223; 359/226
[58] Field of Search ..................... 359/205, 206, 359/216, 217, 218, 215, 223, 226, 662, 204, 207, 196, 197

[56] References Cited

U.S. PATENT DOCUMENTS

| 4,823,002 | 4/1989 | Saito . |
|---|---|---|
| 5,009,472 | 4/1991 | Morimoto . |
| 5,189,546 | 2/1993 | Iizuka . |
| 5,459,601 | 10/1995 | Suzuki et al. ........................ 359/205 |
| 5,691,835 | 11/1997 | Iizuka . |

Primary Examiner—Cassandra Spyrou
Assistant Examiner—Craig Curtis
Attorney, Agent, or Firm—Greenblum & Bernstein, P.L.C.

[57] ABSTRACT

Disclosed is a scanning optical system for emitting a scanning beam onto a surface to be scanned. The scanning optical system is provided with a laser source that emits a laser beam, a deflector that deflects the laser beam emitted by the laser source towards an fθ lens the laser beam passed through the fθ lens scans on the surface to be scanned the fθ lens includes at least one lens which is formed to cancel an uneven intensity distribution characteristic of the scanning optical system within an area where the laser beam scans on the surface to be scanned.

10 Claims, 5 Drawing Sheets

LASER SCANNING OPTICAL SYSTEM

BACKGROUND OF THE INVENTION

The present invention relates to a laser scanning optical system to be employed in a color imaging apparatus such as a color laser beam printer or the like.

An example of a conventional laser scanning optical system is shown in FIG. 5. The scanning optical system is provided with a laser source 11 for emitting a laser beam, a collimating lens 12 for converting the laser beam emitted by the laser source into a parallel light beam. The parallel light beam is incident on a cylindrical lens 13 which converges the incident beam only in one direction so that a line-like image is formed in the vicinity of a polygon mirror 14. The polygon mirror 14 is driven to rotate, and the incident beam is deflected in accordance with the rotation of the polygon mirror 14. In this specification, a plane including the principal ray of the deflected beam is defined as a main scanning plane. The deflected laser beam passes through an fθ lens 15 and forms a beam spot on a photoconductive drum 16. The beam spot formed on the photoconductive drum 16 scans (moves on the photoconductive drum 16) in a direction parallel to a rotation axis Ax of the photoconductive drum 16 (a main scanning is performed). The direction in which the beam spot moves, i.e., the direction parallel to the rotation axis Ax of the photoconductive drum 16 will be referred to as a main scanning direction hereinafter.

During the main scanning, the photoconductive drum 16 is rotated (an auxiliary scanning is performed). As the main scanning and auxiliary scanning are performed, a two-dimensional latent image is formed on the photoconductive drum 16. The fθ lens 15 functions such that a constant angular speed of the incident beam is converted into a constant speed of the beam spot on the photocondutcive drum 16.

In the conventional scanning optical system, even if the intensity of the laser beam emitted by the laser source is constant, the intensity of the beam incident on the photocondutcive drum 16 may vary depending on the position in the main scanning direction.

In such a case, quality of the two-dimensional image may be lowered. That is, when the latent image is developed (toner is applied) and transferred on a recording sheet, a portion of the transferred image which should have even density distribution over the two-dimensional image area, may be formed to have uneven density distribution.

FIG. 4A shows an intensity distribution characteristic of the laser beam on the photoconductive drum 16 in the main scanning direction. In FIG. 4A, Ps denotes a start position of an effective scanning area on the photoconductive drum 16, and Pe denotes an end position of the effective scanning area. Pc denotes the center of the effective scanning area, which coincides with a position where an optical axis Ox of the fθ lens 15 intersects the photoconductive drum 16.

As shown in FIG. 4A, the intensity of the beam is greatest at the center of the scarring area, and decreases towards the peripheral portions.

Such a characteristic is caused by a relationship between an incident angle of the laser beam incident on the reflection surface of the polygon mirror 14 and a reflection ratio thereof, and by a relationship between an incident angle of the laser beam incident on the fθ lens 15 and a transmission ratio thereof.

This characteristic is inconspicuous when the two-dimensional image is a monochrome image. However, such a characteristic would be conspicuous when the scanning optical system is applied to a color image device.

It may be possible to compensate the uneven intensity distribution characteristic as shown in FIG. 4A by providing a filter of which the density distribution is adjusted to cancel the unevenness distribution of the intensity of the beam on the photoconductive drum 16. However, since the density distribution of such a filter should be determined based on the configuration of the fθ lens 15, it is difficult to design and manufacture such a filter. As a result, such a filter would become relatively expensive, and therefore it would be difficult to provide an inexpensive laser scanning optical system for a color imaging apparatus.

SUMMARY OF THE INVENTION

It is therefore an object of the invention to provide an improved laser scanning optical system having an even intensity distribution characteristic within an effective scanning range without increasing the cost thereof.

For the above object, according to the invention, there is provided a scanning optical system for emitting a scanning beam onto a surface to be scanned, which is provided with a laser source that emits a laser beam; a deflector that deflects the laser beam emitted by the laser source to scan within a predetermined scanning area; an fθ lens to which the laser beam deflected by the deflector is incident, the laser beam passed through the fθ lens scans on the surface to be scanned, the fθ lens including at least one lens which is formed to cancel an uneven intensity distribution characteristic of the scanning optical system within an area where the laser beam scans on the surface to be scanned.

In particular, wherein the at least one lens is formed to have gradient overall transmission ratio, the gradient overall transmission ratio being determined based on an inversion of the uneven intensity distribution characteristic of the scanning optical system.

Optionally, at least one lens is formed of material having a predetermined unit transmission ratio, the gradient overall transmission ratio of the at least one lens depending on a shape of the at least one lens.

The at least one lens may be a plano-convex lens, a biconvex lens, or a meniscus lens.

According to another aspect of the invention, there is provided with a scanning optical system for emitting a scanning beam onto a surface to be scanned, provided with a laser source that emits a laser beam; a deflector that deflects the laser beam emitted by the laser source to scan within a predetermined scanning area; an fθ lens to which the laser beam deflected by the deflector is incident, the laser beam passed through the fθ lens scans on the surface to be scanned, the fθ lens including at least one lens which is formed such that overall transmission ratios with respect to laser beams passing through different portions are made different so that intensity distribution characteristic of the laser beam within an area where the laser beam scans on the surface to be scanned is substantially even.

The at least one lens may be constituted such that the overall transmission ratio depends on a shape thereof.

Optionally, the at least one lens has a convex surface, overall transmission ratio of the at least one lens is greater at a central portion of the at least one lens and is smaller at a peripheral portion of the at least one lens.

In particular, wherein the predetermined unit transmission ratio is determined in accordance with: (a) an intensity distribution characteristic the scanning optical system would have if the at least one lens is not formed to compensate the intensity distribution characteristic; and (b) curvature of each surface of the at least one lens.

Preferably, a ratio of an overall transmission ratios of the at least one lens with respect a first beam proceeding along an optical axis to that with respect to a second beam traveling at a peripheral portion of the at least one lens is an inversion of a ratio of an intensity of the first beam on the surface to be scanned if the at least one lens is not formed to compensate the intensity distribution characteristic to an intensity of the second beam on the surface to be scanned if the at least one lens is not formed to compensate the intensity distribution characteristic.

BRIEF DESCRIPTION OF THE ACCOMPANYING DRAWINGS

DESCRIPTION OF THE EMBODIMENT

Hereinafter, the present invention will be described with reference to the accompanying drawings.

Figure 1:
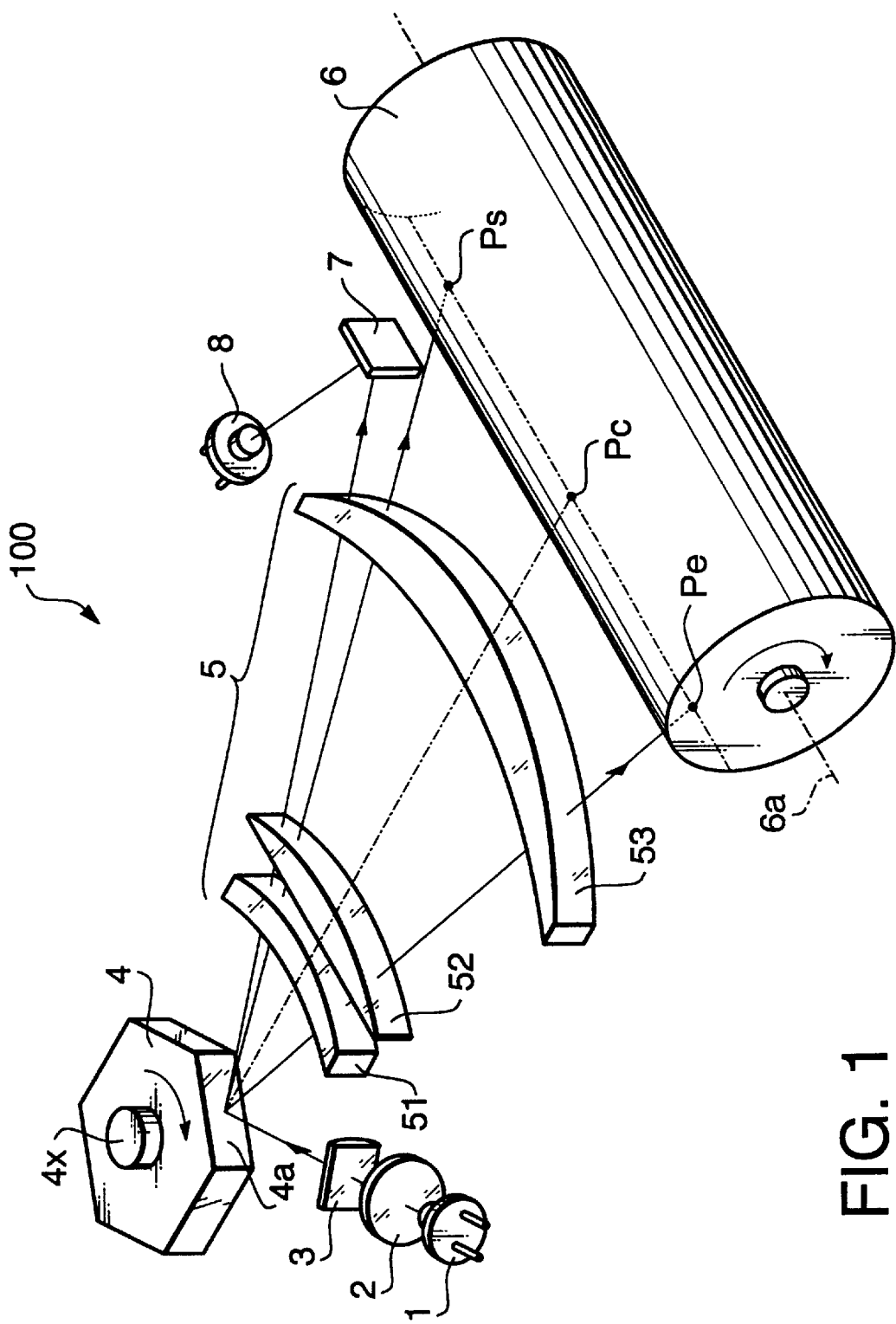
FIG. 1 shows a perspective view of a laser scanning optical device according to an embodiment of the invention.

FIG. 1 is a perspective view schematically showing a structure of a laser scanning optical system 100 according to the present invention.

The laser scanning optical system 100 is provided with:

a laser diode 1 for emitting a laser beam;

a collimating lens 2;

a cylindrical lens 3, a polygon mirror 4;

an fθ lens 5;

a photoconductive drum 6;

a reflector 7; and a light receiving element 8.

The collimating lens 2 and the cylindrical lens 4 are arranged between the laser diode 1 and the polygon mirror 4. The light beam emitted by the laser diode 1 is converted into a parallel beam by the collimating lens 2. The parallel laser beam is incident on the cylindrical lens 3 which has a power in an auxiliary scanning direction (i.e., in a direction parallel to the rotation axis 4x of the polygon mirror 4) such that a line-like image is formed in the vicinity of a reflection surface 4a of the polygon mirror 4.

The polygon mirror 4 has a shape of a regular polygon solid, side surfaces 4a thereof being formed as reflection surfaces. The polygon mirror 4 is driven to rotate about the rotation axis 4x at a high speed in a direction indicated by arrow in FIG. 1. As the polygon mirror 4 rotates, the laser beam incident, from the laser diode 1, on the reflection surface 4a of the polygon mirror 4 is deflected and scans. The scanning laser beam passes through the fθ lens 5, and incident on a photoconductive surface of the photoconductive drum 6. On the photoconductive drum 6, the beam spot scans, within at least an effective scanning range, in a direction parallel to the rotation axis 6a thereof (i.e., in the main scanning direction).

The mirror 7 is arranged to receive the laser beam directed towards a position out of the effective scanning range. The laser beam incident on the mirror 7 via the fθ lens 5 is reflected towards the light receiving element 8. The light receiving element 8 is connected to a not shown control circuit which generates a horizontal synchronizing signal to be used for controlling imaging operation.

Figure 4A:
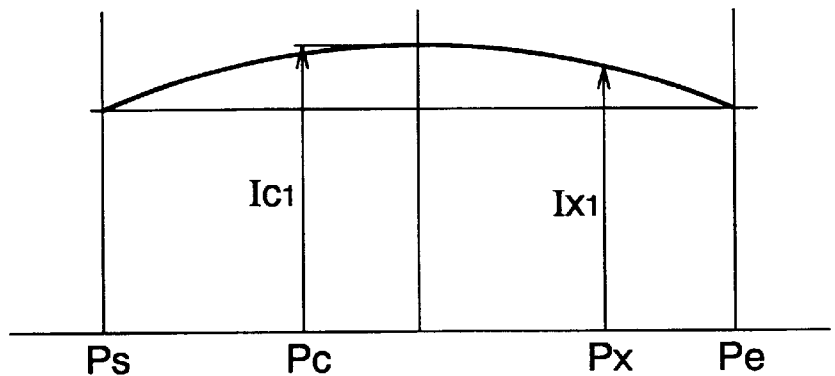
FIG. 4A is a graph showing unevenness of intensity distribution characteristic in a conventional laser scanning optical system.

The fθ lens 5 of the scanning optical system 100 consists of a meniscus type first lens 51, a plano-convex type second lens 52, and a meniscus type third lens 53. If one of the first through third lenses 51–53 is formed such that light transmission characteristic is changed from the central portion towards, in the main scanning direction, the peripheral portion so that the intensity distribution characteristic shown in FIG. 4A is canceled, the intensity distribution characteristic of the entire optical system 100 will be compensated to show an even intensity distribution characteristic.

In the embodiment, the second lens 52 is formed such that the transmission ratio with respect the laser beam passing therethrough gradually changes from the central portion, in the main scanning direction, towards the peripheral portion.

Since the thickness of the second lens 52 is grater at the central portion and smaller at the peripheral portion, the optical path of the beam within the second lens 52 also varies in the similar manner. If an appropriate material is selected for forming the second lens 52, the transmission characteristic of the second lens 52 may be adjusted to cancel the intensity distribution characteristic shown in FIG. 4A.

A method for determining material for the second lens 52 will be described. According to the method, the second lens 52 will be designed to have a desired focal length as the second lens, and further, it is possible to cancel the uneven intensity distribution characteristic shown in FIG. 4A.

Firstly, it is assumed that if a conventional lens is used as the second lens 52, i.e., the plano-convex lens of which transmission ratio distribution characteristic is not adjusted, the intensity distribution characteristic on the photoconductive drum 6 is shown in FIG. 4A. In order to compensate the uneven intensity distribution characteristic shown in FIG. 4A, the second lens 52 should have the transmission ratio distribution characteristics as shown in FIG. 4B, which is an inversion of the characteristics shown in FIG. 4A.

Figure 4B:
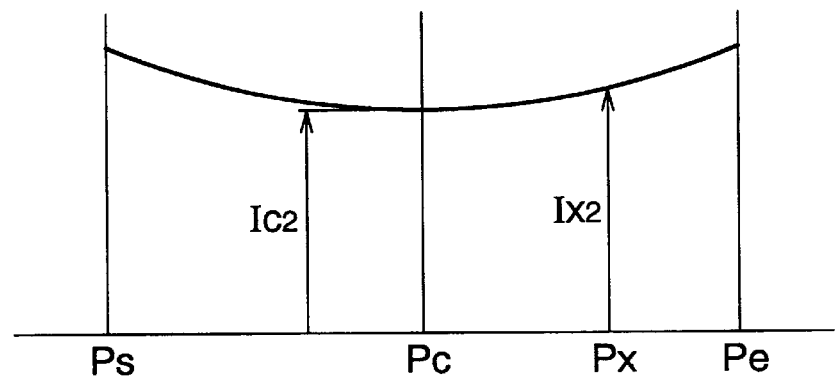
FIG. 4B is a graph showing transmission ratio distribution for compensating the unevenness of intensity distribution characteristic shown in FIG. 4A.
Figure 4C:
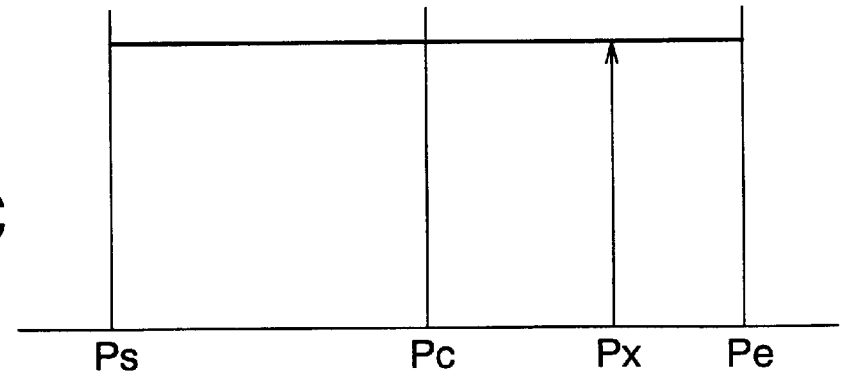
FIG. 4C is a graph showing compensated intensity distribution characteristic.
Figure 5:
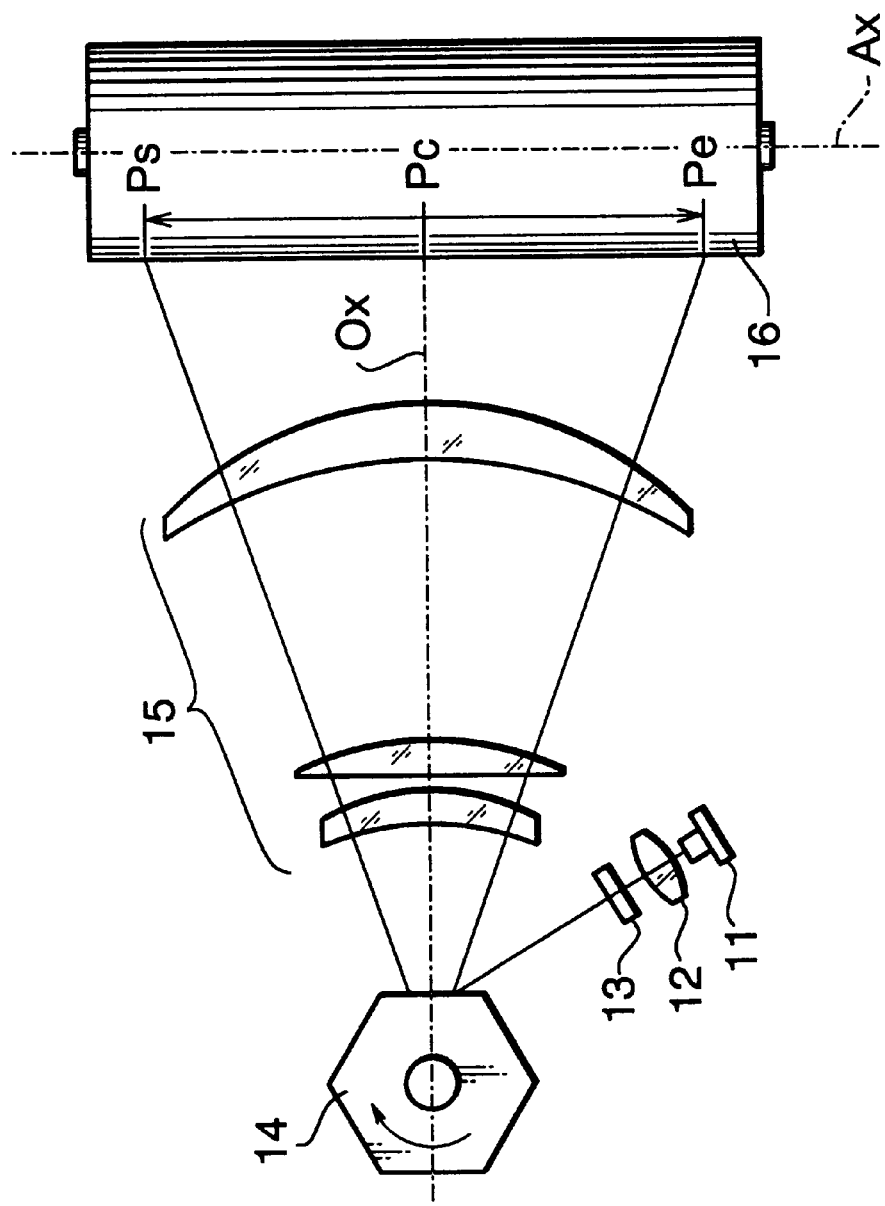
FIG. 5 is a plan view showing a schematic configuration of a conventional laser scanning optical system.

The following symbols are defined for explaining the method with reference to FIGS. 4A–4C:

Ic1 represents the intensity of the beam at the center Pc of the photoconductive drum 6;

Ix1 is the intensity of the beam at a position Px on the photoconductive drum 9;

Ic2 represents the intensity of the beam emerged from the second lens 52, the beam being directed to the center Pc of the photoconductive drum 9 after it passes through the second lens 52; and Ix2 represents the intensity of the beam emerged from the second lens 52, the beam being directed to the point Px on the photoconductive drum.

It is assumed that the intensity of the laser beam emitted by the laser diode 1 is constant.

Further, a ratio ρ1 is defined as a ratio of the intensity Ix1 to the intensity Ic1 (i.e., ρ1=Ix1/Ic1), and a ratio ρ2 is defined as a ratio of the intensity Ix2 to the intensity Ic2 (i.e., ρ2=Ix2/Ic2). If the second lens 52 satisfies the following condition:

$$\rho1 \times \rho2 = 1 \tag{5}$$

for any point Px within the effective scanning area, the intensity distribution characteristic becomes even as shown in FIG. 4C.

If the second lens 52 is made of material whose transmission ratio per unit length (i.e., 1 mm) is τ (this ratio will be referred to as a unit transmission ratio), the transmission ratio of the second lens (i.e., the transmission ratio of the lens along an optical path; which will be referred to as an overall transmission ratio) varies at a position in the main scanning direction depending on the shape of the second lens 52. In other words, the shape of the second lens on the main scanning plane determines the overall transmission characteristic of the second lens 52. Since the second lens 52 is a plano-convex lens, the ratio ρ2 with respect to the beam passed through the central portion of the second lens 52 is less than that of the beam passed through the peripheral portion.

Figure 2:
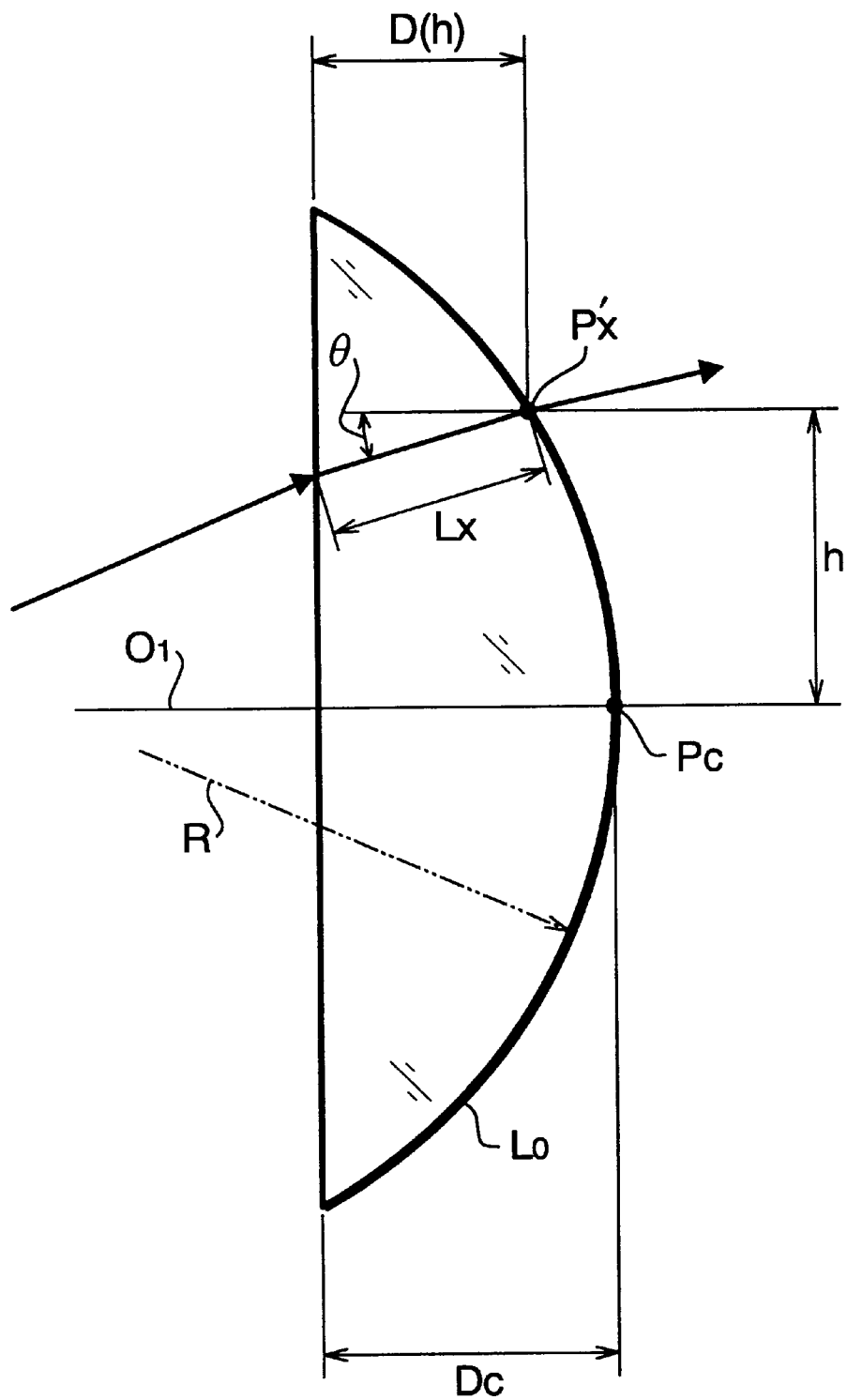
FIG. 2 shows a diagram illustrating method of obtaining optical material for an fθ lens.

FIG. 2 is a diagram illustrating calculation of the overall transmission ratio of the second lens 52. In FIG. 2, R represents a radius of curvature of a convex surface L0 of the second lens 52, and Dc represents a thickness of the second lens 52 along the optical axis O1, P'x is a point on the surface L0, the beam passing the point P'x reaches the point Px on the photoconductive drum 6, Lx represents a length of a path along which the beam travels, within the second lens 52, and is directed to the point Px, and h represents a height (distance) of the point P'x with respect to the optical axis O1. In FIG. 2, a thickness D(h) of the second lens 52 at the point P'x is expressed, as a function of the height h, by equation (1):

$$D(h) = Dc - \left(R - \sqrt{R^2 - h^2}\right) \tag{1}$$

If an angle formed between the beam passing the point P'x and the optical axis O1 is represented by θ, the optical path length Lx(h, θ) at height h is expressed by equation (2):

$$Lx(h, \theta) = \frac{D(h)}{\cos\theta} = \frac{Dc - \left(R - \sqrt{R^2 - h^2}\right)}{\cos\theta} \tag{2}$$

If the unit transmission ratio, i.e., the transmission ratio per unit (1 mm) of the second lens 52 is represented by τr, the overall transmission ratio τc of the second lens 52 with respect to the beam passing the point Pc is expressed by equation (3):

$$\tau c = \tau r^{Dc} \tag{3}$$

Similarly, the overall transmission ratio with respect to the point P'x is calculated by equation (4):

$$\tau x = \tau r^{\frac{Dc - \left(R - \sqrt{R^2 - h^2}\right)}{\cos\theta}} \tag{4}$$

If it is assumed that the intensity of the light beam is substantially proportional to the overall transmission ratio, the ratio ρ2 is calculated by equation (5):

$$\rho2 = \frac{\tau x}{\tau c} = \frac{\frac{Dc - \left(R - \sqrt{R^2 - h^2}\right)}{\cos\theta}}{\tau r^{Dc}} \tag{5}$$

Based on the above equation (3), and equation (5), the overall transmission ratio τr is expressed as follows:

$$\tau r = \rho2^{\left[\frac{1}{\left(\frac{1}{\cos\theta} - 1\right)Dc - \frac{1}{\cos\theta}\left(R - \sqrt{R^2 - h^2}\right)}\right]} \tag{6}$$

Since ρ2=1/ρ1, equation (7) can be modified to equation (7):

$$\tau r = \rho1^{\left[\frac{1}{\frac{1}{\cos\theta}\left(R - \sqrt{R^2 - h^2}\right) - \left(\frac{1}{\cos\theta} - 1\right)Dc}\right]} \tag{7}$$

Therefore, if the second lens 52 is formed of the material having the unit transmission ratio of τr satisfying the above equation (7) for any points P'x on the surface L0, the intensity distribution characteristic of the beam on the photoconductive drum 6 can be made substantially even, as shown in FIG. 4C, over the effective scanning range.

In practice, however, it may be difficult to satisfy the above condition for all the point P'x on the lens surface L0. Therefore, practically, the overall transmission ratios τrs and τre of the second lens 52 with respect to the beam directed to the start and end positions Ps and Pe are calculated, an averaged overall transmission ratio τrav is obtained, and material having the overall transmission ratio of τrav is used for forming the second lens 52. Generally, the intensity of the light beam is smallest at the start and end of the scanning area. Accordingly, even if the overall transmission ratio is determined with respect to the start and end positions, substantially an even intensity distribution can be achieved so that the scanning optical system is applicable to the color imaging apparatus.

It should be noted that a remarkable effect can be confirmed when 1.03<ρ2<1.20. If the ratio ρ2 is out of this range, it may be difficult to compensate the unevenness of the intensity distribution characteristic only by adjusting the overall transmission ratio of the second lens 52.

It is preferable that the second lens 52 may satisfy the following conditions:

$$60 < R < 250 \text{ (mm)} \tag{8};$$

$$0 < h < 80 \text{ (mm)} \tag{9}; \text{ and}$$

$$10 < Dc < 25 \text{ (mm)} \tag{10}.$$

In the above-described embodiment, the second lens 52 is used for compensating the unevenness of the intensity distribution characteristic of the scanning optical system 100 on the photoconductive drum 6. It should be noted that the invention is not limited to such a structure. For example, the first lens 51 or the third lens 53 may also be used for compensating the unevenness of the intensity distribution characteristic. It should further be noted that the invention may be applied to a scanning optical system employing an fθ lens consisting of more or less than three lenses.

Figure 3A:
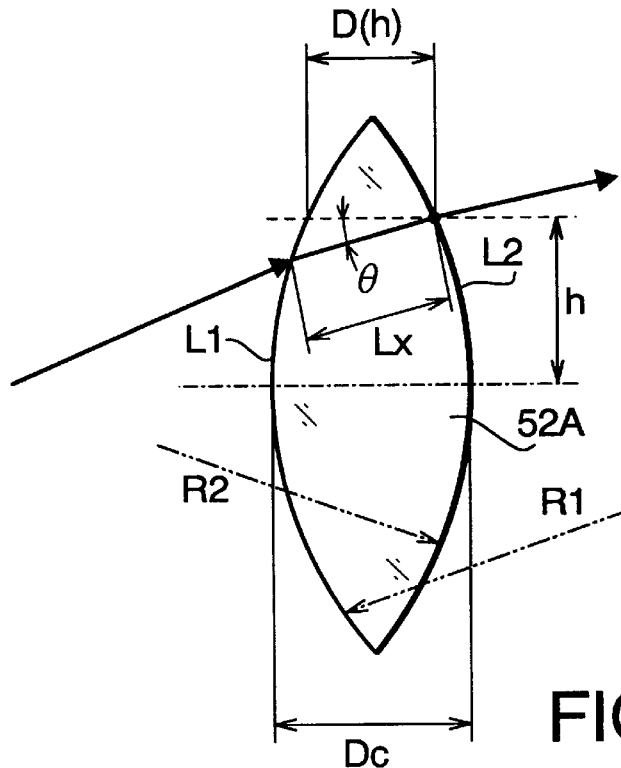
FIG. 3A shows a biconvex lens to which the present invention is applied.

Further, the lens formed to compensate the unevenness of the intensity distribution is not limited to the plano-convex lens. If a biconvex lens 52A as shown FIG. 3A is used for compensation, the overall transmission ratio τa may be determined in accordance with the following equation (11):

$$\tau a = \rho l \left[ \frac{1}{\frac{1}{\cos\theta}\{(R1-\sqrt{R1^2-h^2})+(R2-\sqrt{R2^2-h^2})\}-(\frac{1}{\cos\theta}-1)Dc} \right] \quad (11)$$

where, R1 and R2 denote radii of surfaces L1 and L2 of the biconvex lens 52A.

Figure 3B:
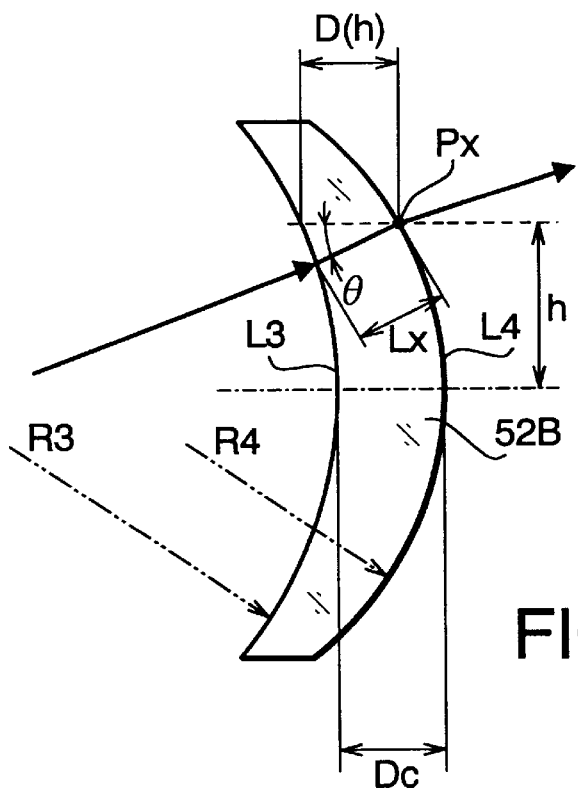
FIG. 3B shows a meniscus lens to which the present invention is applied.

If a meniscus lens 52B as shown FIG. 3B is used for compensation, the overall transmission ratio τb may be determined in accordance with the following equation (12):

$$\tau b = \rho l \left[ \frac{1}{\frac{1}{\cos\theta}\{(R3-\sqrt{R3^2-h^2})-(R4-\sqrt{R4^2-h^2})\}-(\frac{1}{\cos\theta}-1)Dc} \right] \quad (12)$$

where, R3 and R4 denote radii of surfaces L3 and L4 of the biconvex lens 52B.

As described above, according to the invention, by forming one of the fθ lens using glass material having the overall transmission ratio calculated above, the intensity distribution characteristic of the scanning optical system on the photoconductive drum can be made substantially even, and therefore the scanning optical system can be applied to the color imaging apparatus. Since the unevenness of the intensity distribution characteristic is compensated, it becomes unnecessary to form a filter having a particular density distribution for canceling the uneven intensity distribution characteristic of the scanning optical system, which contributes to reduction of manufacturing cost of the scanning optical system.

The present disclosure relates to subject matter contained in Japanese Patent Application No. HEI 09-207767, filed on Aug. 1, 1997, which is expressly incorporated herein by in its entirety.

What is claimed is:

1. A scanning optical system for emitting a scanning beam onto a surface to be scanned, comprising:

a laser source that emits a laser beam;

a deflector that deflects said laser beam emitted by said laser source to scan withing a predetermined scanning area;

an fθ lens to which said laser beam deflected by said deflector is incident, said laser beam passing through said fθ lens scans on said surface to be scanned, said fθ lens including at least one lens which cancels an uneven intensity distribution characteristic of said scanning optical system within an area where said laser beam scans on said surface to be scanned;

wherein said at least one lens has a gradient transmission ratio, said gradient transmission ratio being determined based on an inversion of said uneven intensity distribution characteristic of said scanning optical system; and wherein said at least one lens is formed of material having a predetermined unit transmission ratio, said gradient transmission ratio of said at least one lens depending on a shape of said at least one lens.

2. The scanning optical system according to claim 1, wherein said at least one lens has a convex surface.

3. The scanning optical system according to claim 2, wherein said at least one lens comprises a plano-convex lens.

4. The scanning optical system according to claim 2, wherein said at least one lens comprises a biconvex lens.

5. The scanning optical system according to claim 2, wherein said at least one lens comprises a meniscus lens.

6. A scanning optical system for emitting a scanning beam onto a surface to be scanned, comprising:

a laser source that emits a laser beam;

a deflector that deflects said laser beam emitted by said laser source to scan within a predetermined scanning area;

an fθ lens to which said laser beam deflected by said deflector is incident, said laser beam passing through said fθ scans on said surface to be scanned, said fθ lens including at least one lens, such that overall transmission ratios with respect to laser beams passing through different portions are different so that an intensity distribution characteristic of said laser beam within an area where said laser beam scans on said surface to be scanned is substantially even;

and wherein said overall transmission ratios depend on a shape of said at least one lens.

7. The scanning optical system according to claim 6, wherein said at least one lens has a convex surface, overall transmission ratio of said at least one lens is smaller at a central portion of said at least one lens and is greater at a peripheral portion of said at least one lens.

8. The scanning optical system according to claim 6, wherein said at least one lens has a convex surface, overall transmission ratio of said at least one lens is smaller at a central portion of said at least one lens and is greater at a peripheral portion of said at least one.

9. The scanning optical system according to claim 6, wherein said overall transmission ratio is determined in accordance with:

(a) an intensity distribution characteristic said scanning optical system would have if said at least one lens is not formed to compensate said intensity distribution characteristic; and (b) curvature of each surface of said at least one lens.

10. The scanning optical system according to claim 9, wherein, a ratio of an overall transmission ratios of said at least one lens with respect a first beam proceeding along an optical axis to that with respect to a second beam traveling at a peripheral portion of said at least one lens is an inversion of a ratio of an intensity of said first beam on said surface to be scanned if said at least one lens is not formed to compensate said intensity distribution characteristic to an intensity of said second beam on said surface to be scanned if said at least one lens is not formed to compensate said intensity distribution characteristic.

* * * * *